US009366708B2

(12) United States Patent
White et al.

(10) Patent No.: US 9,366,708 B2
(45) Date of Patent: Jun. 14, 2016

(54) APPARATUS COMPRISING A FLEXIBLE SUBSTRATE AND A COMPONENT SUPPORTED BY THE FLEXIBLE SUBSTRATE

(71) Applicant: Nokia Corporation, Espoo (FI)

(72) Inventors: Richard White, Huntingdon (GB); Samiul Haque, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 673 days.

(21) Appl. No.: 13/760,698

(22) Filed: Feb. 6, 2013

(65) Prior Publication Data

US 2014/0218057 A1 Aug. 7, 2014

(51) Int. Cl.

| | |
|---|---|
| ***G01R 27/26*** | (2006.01) |
| ***G01R 3/00*** | (2006.01) |
| ***G06F 3/041*** | (2006.01) |
| ***G06F 3/044*** | (2006.01) |

(52) U.S. Cl.

CPC .............. *G01R 27/2605* (2013.01); *G01R 3/00* (2013.01); *G06F 3/044* (2013.01); *G06F 3/0414* (2013.01); *G06F 2203/04105* (2013.01); *Y10T 29/43* (2015.01); *Y10T 29/435* (2015.01)

(58) Field of Classification Search

CPC ........ G01R 19/04; G01F 23/265; H01G 4/26; G01N 33/2847

USPC ................. 324/600, 686–693, 702–710, 676, 324/76.11, 76.77, 323, 360, 120

See application file for complete search history.

(56) References Cited

U.S. PATENT DOCUMENTS

| | | | | |
|---|---|---|---|---|
| 2007/0257017 | A1 | 11/2007 | Deangelis et al. | 219/211 |
| 2010/0060077 | A1 | 3/2010 | Paulus et al. | 307/10.1 |
| 2010/0091468 | A1 | 4/2010 | Tsao | 361/749 |
| 2010/0141605 | A1 | 6/2010 | Kang et al. | 345/174 |
| 2010/0201635 | A1 | 8/2010 | Klinghult et al. | 345/173 |
| 2010/0245246 | A1 | 9/2010 | Rosenfeld et al. | 345/163 |
| 2011/0115732 | A1 | 5/2011 | Coni et al. | 345/173 |
| 2011/0141052 | A1 | 6/2011 | Bernstein et al. | 345/174 |
| 2011/0242138 | A1 | 10/2011 | Tribble | 345/663 |
| 2011/0248929 | A1 | 10/2011 | Tong et al. | 345/173 |
| 2011/0273399 | A1 | 11/2011 | Lee | 345/174 |
| 2012/0038583 | A1 | 2/2012 | Westhues et al. | 345/174 |
| 2012/0086667 | A1 | 4/2012 | Coni et al. | 345/174 |
| 2012/0090757 | A1 | 4/2012 | Buchan et al. | 156/60 |
| 2012/0275621 | A1 | 11/2012 | Elko | 381/92 |
| 2013/0063859 | A1 * | 3/2013 | Low | H01G 4/232 361/301.4 |

FOREIGN PATENT DOCUMENTS

| | | |
|---|---|---|
| DE | 20 2012 10336 U1 | 9/2012 |

* cited by examiner

*Primary Examiner* — Melissa Koval
*Assistant Examiner* — Trung Nguyen
(74) *Attorney, Agent, or Firm* — Harrington & Smith

(57) ABSTRACT

An apparatus including a flexible substrate; a component supported by the flexible substrate; a first input electrode, supported by the flexible substrate and configured to form a first capacitor with a second input electrode and to provide an input to the component; and a first output electrode, supported by the flexible substrate and configured to form a second capacitor with a second output electrode and to provide an output from the component.

20 Claims, 7 Drawing Sheets

APPARATUS COMPRISING A FLEXIBLE SUBSTRATE AND A COMPONENT SUPPORTED BY THE FLEXIBLE SUBSTRATE

TECHNOLOGICAL FIELD

Embodiments of the present invention relate to an apparatus comprising a flexible substrate and a component supported by the flexible substrate.

BACKGROUND

It is common practice, when forming electronic components on non-flexible substrates to create through-holes or vias to between different layers as routes for conductive interconnect that forms a galvanic connection between the layers.

BRIEF SUMMARY

According to various, but not necessarily all, embodiments of the invention there is provided an apparatus comprising: a flexible substrate; a component supported by the flexible substrate; a first input electrode, supported by the flexible substrate and configured to form a first capacitor with a second input electrode and to provide an input to the component; a first output electrode, supported by the flexible substrate and configured to form a second capacitor with a second output electrode and to provide an output from the component.

According to various, but not necessarily all, embodiments of the invention there is provided an apparatus comprising: a flexible substrate; a sensing component supported by the flexible substrate; a first input electrode, supported by the flexible substrate and configured to form a first input capacitor with a second input electrode that is configured to receive a time-variable signal from a drive circuit; and a first output electrode, supported by the flexible substrate and configured to form a second output capacitor with a second output electrode that is configured to provide a time variable output signal to a detection circuit.

According to various, but not necessarily all, embodiments of the invention there is provided a method of manufacturing an apparatus comprising a component, comprising:

selectively forming at least one first input electrode on a flexible substrate at a position that enables the at least one first input electrode to form in the manufactured apparatus a first capacitor with a second input electrode;

selectively forming at least one first output electrode on the flexible substrate at a position that enables the at least one first output electrode to form in the manufactured apparatus a second capacitor with a second output electrode;

and selectively forming at least one component in electrical connection between the first input electrode and the first output electrode.

BRIEF DESCRIPTION

For a better understanding of various examples of embodiments of the present invention reference will now be made by way of example only to the accompanying drawings in which.

Figure 6:
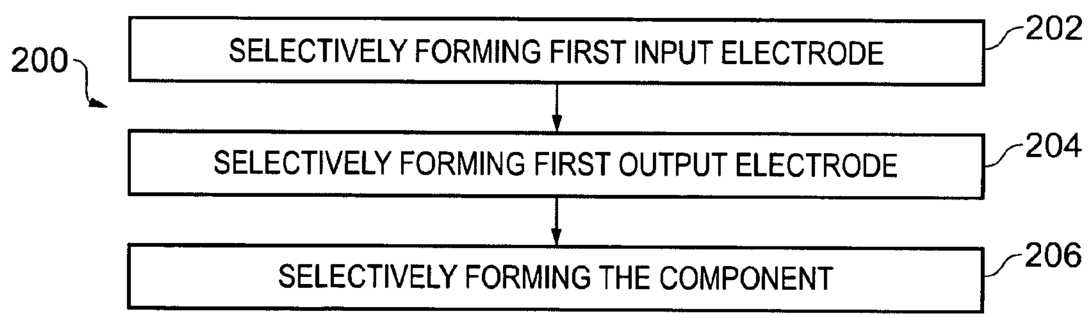
FIG. 6 illustrates a method of manufacturing an apparatus.
Figure 13:
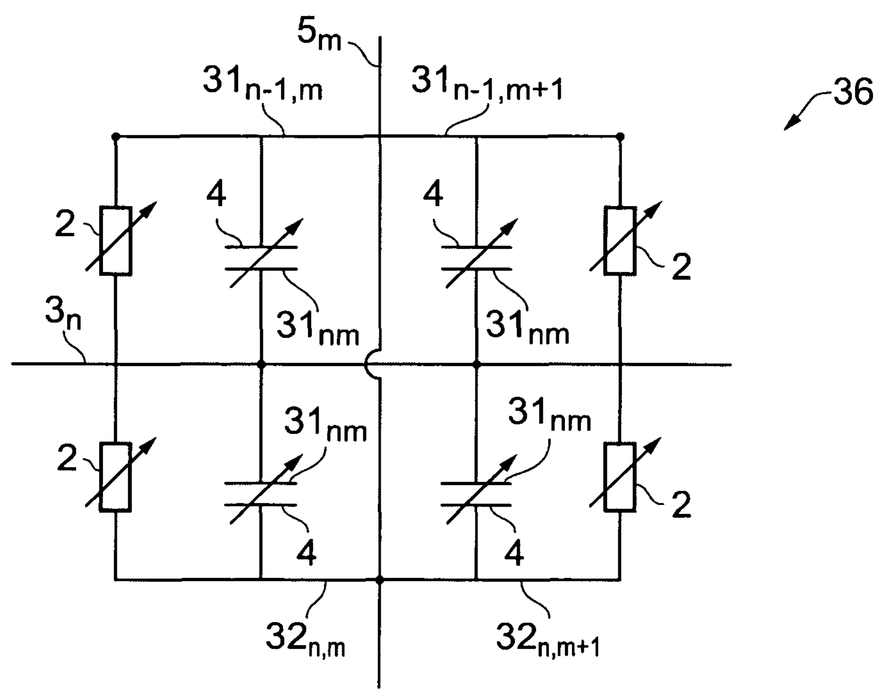
Figure 14A:
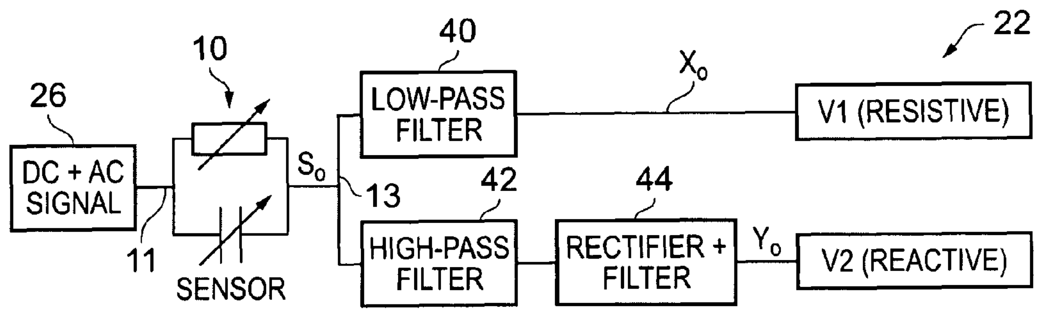
Figure 14B:
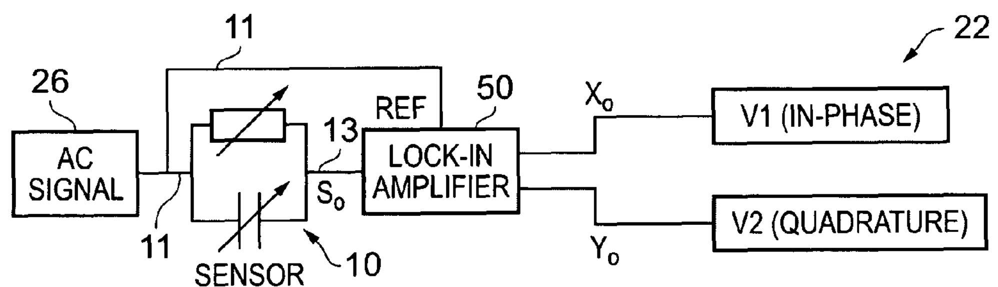
Figure 15:
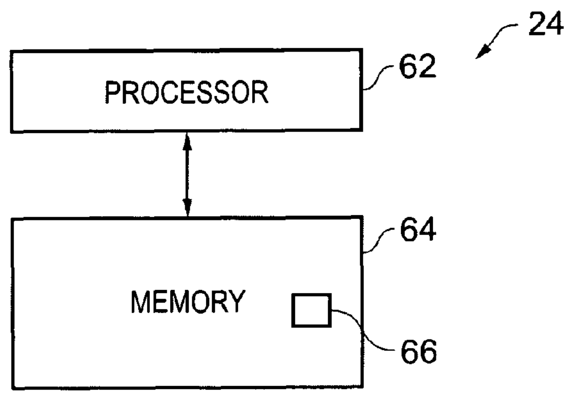
Figure 16:
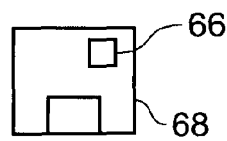
Figure 17:
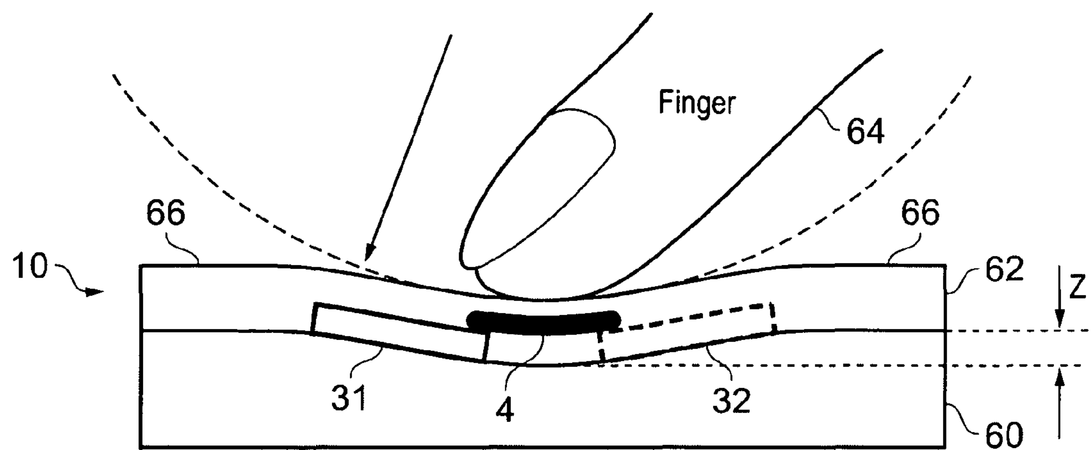
Figure 18:
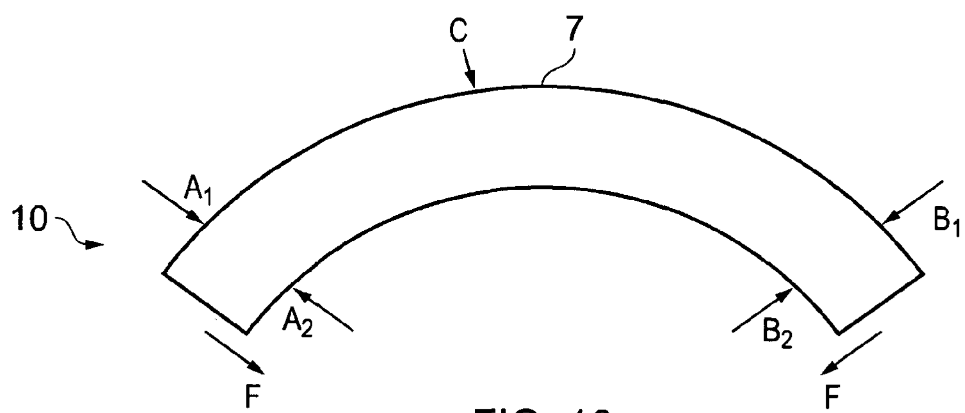

FIG. 13 schematically illustrates a circuit diagram for a capacitor cell associated with FIG. 6;

FIGS. 14A and 14B each illustrate different examples of a system comprising a signal generator for providing the input signal to the capacitance touch sensor arrangement with integrated at least one variable resistor sensor and processing circuitry configured to detect a real and imaginary components;

FIG. 15 illustrates an example of analysis circuitry;

FIG. 16 illustrates an example of a record carrier comprising computer code;

FIG. 17 illustrates an example cross-section through a portion of the apparatus;

FIG. 18 illustrates an example of contortion of an apparatus; and

Figure 19:
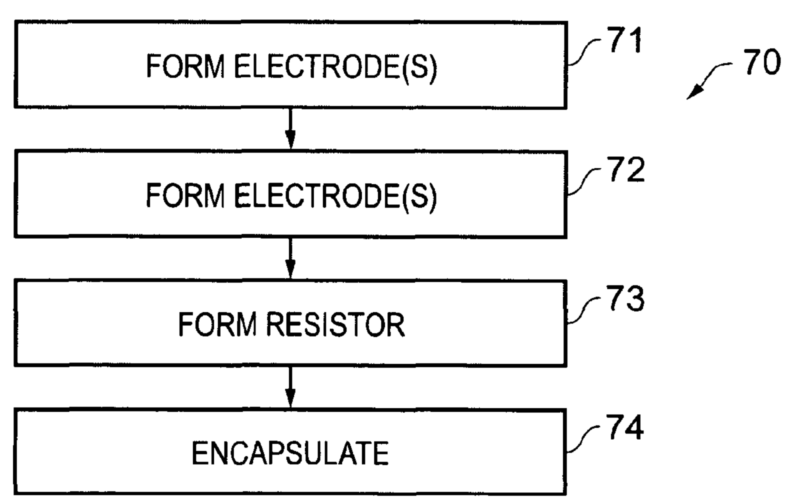

FIG. 19 illustrates a manufacturing method.

For ease of understanding similar reference numerals identify similar features in different figures.

DETAILED DESCRIPTION

Various figures illustrate examples of an apparatus 10 comprising: a flexible substrate 100; a component 102 supported by the flexible substrate 100; a first input electrode 112, supported by the flexible substrate and configured to form a first capacitor 114 with a second input electrode 116 and to provide an input 104 to the component 102; and a first output electrode 122, supported by the flexible substrate 100 and configured to form a second capacitor 124 with a second output electrode 120 and to provide an output 106 from the component 102.

The components 102 may thus be surface mounted without applying heat or pressure. When the apparatus 2 already comprises graphene or other flexible, two-dimensional material, this is useful as it prevents degradation of such materials.

Figure 1:
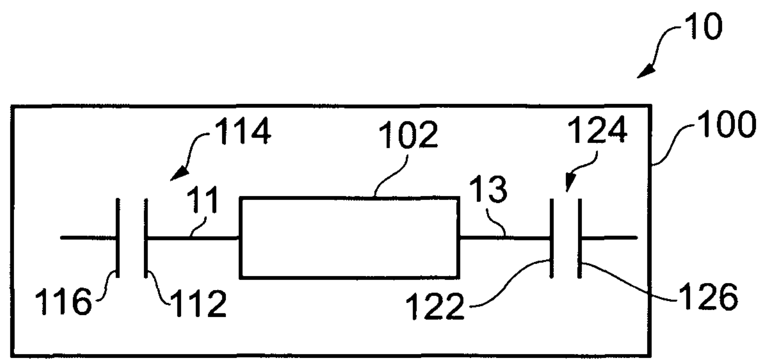
FIG. 1 illustrates an example of an apparatus comprising a flexible substrate and a component 102.

FIG. 1 illustrates an example of an apparatus 10. The apparatus 10 comprises: a flexible substrate 100; a component 102; a first input electrode 112; and a first output electrode 122.

The component 102, the first input electrode 112; and the first output electrode 122 are supported by the flexible substrate 100.

The first input electrode 112 is configured to form a first capacitor 114 with a second input electrode 116. The first input electrode 112 is configured to provide an input signal 11 to the component 102.

The first output electrode 122 is configured to form a second capacitor 124 with a second output electrode 126. The first output electrode 122 is configured to provide an output signal 13 from the component 102.

Figure 2:
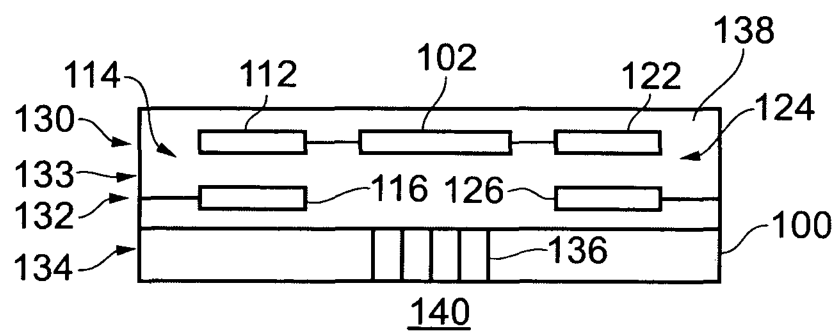
FIG. 2 illustrates an example of the apparatus illustrated in FIG. 1.

FIG. 2 illustrates an example in which the component 102, the first input electrode 112 and the first output electrode 122 are flexible. Also, in this example, the second input electrode 116 and the second output electrode 126 are flexible. This enables the apparatus 10 to be flexible.

In FIG. 2, the first input electrode 112, the component 102, and the first output electrode 122 occupy a common layer 130.

The first input electrode 112 and the second input electrode 116 are arranged as a first parallel plate capacitor 114. The first input electrode 112 is in an upper layer 130 and the second input electrode 116 occupies a different lower layer 132. The flexible substrate 100 occupies a layer 134 beneath the lower layer 132.

The first output electrode 122 and the second output electrode 126 are arranged as a second parallel plate capacitor 124. The first output electrode 122 is in the upper layer 130 and the second output electrode 126 occupies the lower layer 132.

An encapsulation layer 138 covers the first input electrode 112, the component 102, and the first output electrode 122.

The first parallel plate capacitor 114 and the second parallel plate capacitor 124 both have a large capacitor plate area, a small capacitor plate separation and a dielectric 133 between the electrodes of the parallel plate capacitor that has a high relative permittivity.

The second input electrode 116 and the second output electrode 126 are, in this example surface-mounted, for example by printing, stamping, lamination on the underlying flexible substrate 100. The process can, for example, be in a continuous roll to roll printed system. A dielectric layer 133 overlies the second input electrode 116 and the second output electrode 126.

The component 102, the first input electrode 112 and the first output electrode 122 are surface-mounted, for example by printing, on the dielectric layer 133.

The second input electrode 116, the second output electrode 126, the first input electrode 112, the component 102, the first output electrode 122, the flexible substrate 100, the dielectric layer 133 and the encapsulation layer 138 are, in this example, transparent. The apparatus 10 is therefore transparent in this example and may, for example, overlie a flexible display 140.

The first capacitor 114 and the second capacitor 124 enable input to and output from the component 102 without having to form galvanic direct contacts.

The component 102 may, in some embodiments operate as a sensor. The flexible substrate 100, in this example, may comprise multiple through apertures 136 to the component 102. In this example, the order of the layers 130, 132 may be reversed so that the component 102 is adjacent the flexible substrate 100 and the through apertures 136.

Figure 3A:
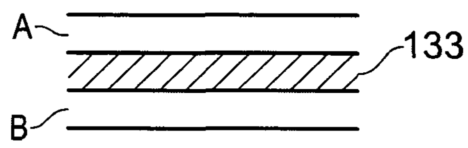
FIG. 3A illustrates an example of the apparatus with two layers separated by a dielectric layer.

FIG. 3A illustrates an apparatus 10 with layers A and B separated by a dielectric layer 133.

In this example, the first input electrode 112, the component 102, and the first output electrode 122 may occupy the layer A. The second input electrode 116 and the second output electrode 126 may occupy layer B.

Alternatively, in this example, the first input electrode 112, the component 102, and the first output electrode 122 may occupy the layer B. The second input electrode 116 and the second output electrode 126 may occupy layer A.

Figure 3B:
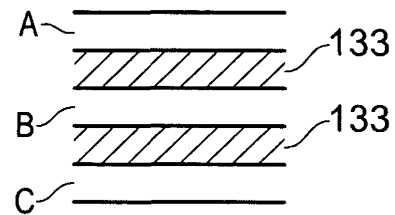
FIG. 3B illustrates an apparatus with three layers separated by dielectric layers.

FIG. 3B illustrates an apparatus 10 with layers A and B separated by a dielectric layer 133 and layers B and C separated by a further dielectric layer 133.

In this example, the first input electrode 112, the component 102, and the first output electrode 122 may occupy the layer B. The second input electrode 116 and the second output electrode 126 may occupy layer layers A and/or C. For example, the second input electrode 116 and the second output electrode 126 may occupy different layers A, C.

Figure 4:
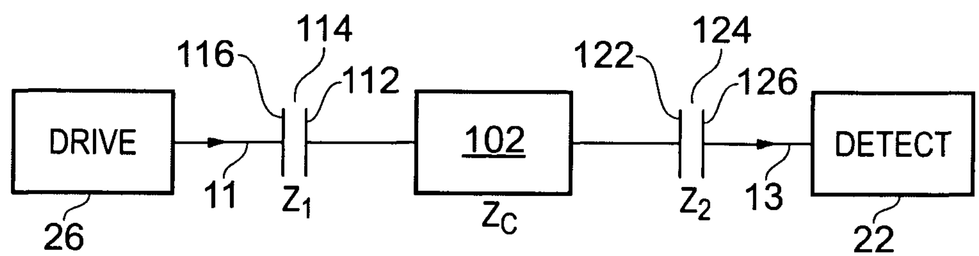
FIG. 4 illustrates an example of an apparatus comprising a flexible substrate and a component supported by the flexible substrate.

FIG. 4 illustrates an example of an apparatus 10 comprising, as in FIG. 1, a flexible substrate 100; a component 102 supported by the flexible substrate 100; a first input electrode 112, supported by the flexible substrate 100 and configured to form a first input capacitor 114 with a second input electrode 116; and a first output electrode 122, supported by the flexible substrate 100 and configured to form a second output capacitor 124 with a second output electrode 126

The apparatus 10 additionally comprises drive circuitry 26 configured to provide a time varying input signal 11 at the second input electrode 116. The signal 11 passes through the first capacitor 114 to the first input electrode 112. The first input electrode 112 is operatively connected to the component 102 and provides the signal 11 to the component 102.

The first output electrode 122 is operatively connected to the component 102. The component 102 provides an output signal 13 to the first output electrode 122. The time-varying signal 13 passes through the second capacitor 124 to the second output electrode 126. The second output electrode 126 is operatively connected to processing circuitry 22 that operates as a detection circuit and provides the signal 13 to the processing circuitry 22.

The processing circuitry 22 is configured to process the output signal 13 to determine, at detection frequencies, at least a complex impedance of the component 102.

At the detection frequencies $\omega_D$, the impact of the electrical impedance $Z_C$ of the component is resolvable from the impact on measurements of the total combined impedance of the component 102, the first capacitor 114 and the second capacitor 124. The component impedance $Z_C$ changes due to changes in a parameter.

As an example, at the detection frequencies $\omega_D$, the first capacitor 114 may have an electrical impedance $Z_1$ that is less than the electrical impedance $Z_C$ of the component 102 i.e. $Z_1(\omega_D)<Z_C(\omega_D)$ and the second capacitor 124 has an electrical impedance $Z_2$ that is less than the electrical impedance $Z_C$ of the component 102 i.e. $Z_2(\omega_D)<Z_C(\omega_D)$. As the first capacitor 114, the component 102 and the second capacitor 124 are in series, the impedance of the series combination is dominated by the largest impedance $Z_C(\omega_D)$. The component impedance $Z_C$ changes due to changes in a parameter.

Additionally, or alternatively, as an example, at the detection frequencies $\omega_D$, the first capacitor 114 may have an electrical impedance $Z_1$ that changes, in response to changes in a first parameter p, less than the electrical impedance $Z_C$ of the component 102 changes, in response to the changes in the first parameter p i.e. $dZ_1(\omega_D)/dp<dZ_C(\omega_D)/dp$ and the second capacitor 124 has an electrical impedance $Z_2$ that changes, in response to changes in the first parameter p less than the electrical impedance $Z_C$ of the component 102 changes, in response to changes in the first parameter p i.e. $dZ_2(\omega_D)/dp<dZ_C(\omega_D)/dp$. As the first capacitor 114, the component 102 and the second capacitor 124 are in series, changes in the impedance of the series combination is dominated by the largest change in impedance $dZ_C(\omega_D)/dp$.

Additionally, or alternatively, as an example, at the detection frequencies $\omega_{D'}$, the first capacitor 114 has an electrical impedance $Z_1$ that changes, in response to changes in a second parameter q, less than the electrical impedance $Z_C$ of the component 102 changes, in response to the changes in the second parameter q i.e. $dZ_1(\omega_{D'})/dq<dZ_C(\omega_{D'})/dq$ and the second capacitor 124 has an electrical impedance $Z_2$ that changes, in response to changes in the second parameter q less than the electrical impedance $Z_C$ of the component 102 changes, in response to changes in the second parameter q i.e. $dZ_2(\omega_{D'})/dq<dZ_C(\omega_{D'})/dq$. As the first capacitor 114, the component 102 and the second capacitor 124 are in series, changes in the impedance of the series combination is dominated by the largest change in impedance $dZ_C(\omega_{D'})/dq$.

The detection frequency or frequencies $\omega_D$ for detecting changes consequent on the first parameter may be the same (wholly overlapping), partially the same (partially overlapping) or different (not overlapping) as the detection frequency or frequencies $\omega_{D'}$ for detecting changes consequent on the second parameter.

The drive circuitry 26 is configured to provide a time varying input signal 11 that comprises components at the respective detection frequency or frequencies $\omega_D$, $\omega_{D'}$. The processing circuitry 22 is configured to process the output signal 13 to determine, at at least the detection frequency or frequencies, at least a complex impedance of the component 102.

Figure 5A:
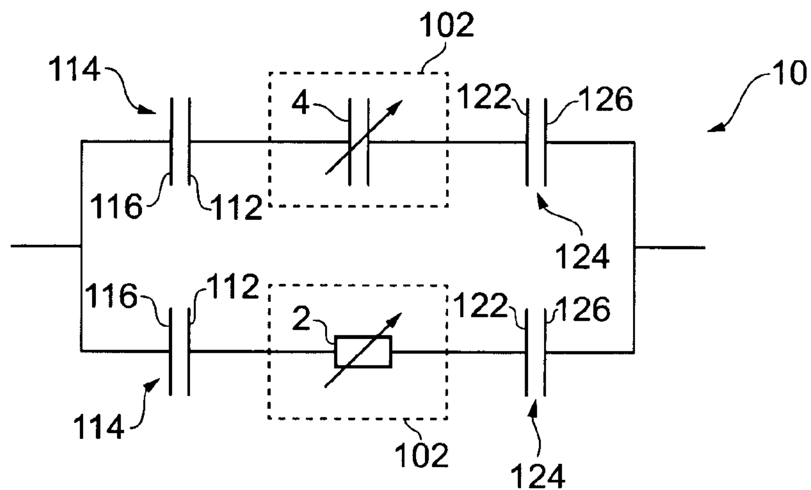
FIG. 5A illustrates an example of an apparatus with multiple components.
Figure 5B:
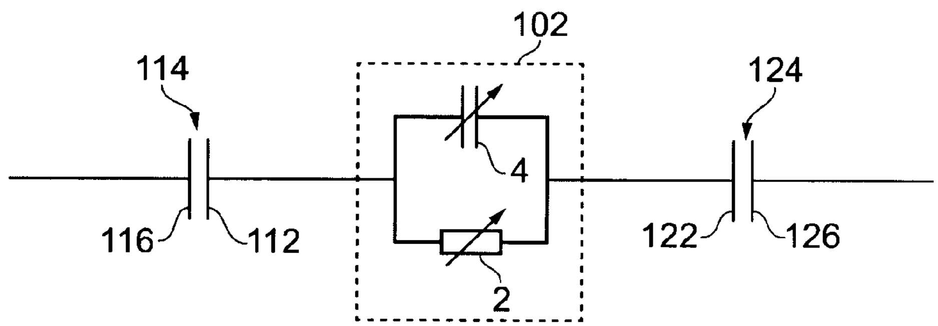
FIG. 5B illustrates an example of an apparatus with a single component.

Referring to FIGS. 5A and 5B, the component 102 may comprise a capacitor that has a capacitance 4 that varies with a sensed parameter and/or a resistor that has a resistance 2 that varies with a different sensed parameter.

Each component 102 is supported by the flexible substrate 100. Each component 102 is configured to receive an input via a first capacitor 114 and to provide an output via a second capacitor 124.

In FIG. 5A, the apparatus 10 comprises multiple components 102. Referring back to FIGS. 2, 3A and 3B, these components 102 may be in the same or different layers of the apparatus 10.

Each component 102 is serially connected between its own first input capacitor 114 and its own second output capacitor 124, as previously described.

A first component 102 comprises a capacitance 4 that varies with a sensed parameter. The capacitance 4 may, for example, vary when a user finger touches or approaches the apparatus 10. In some embodiments, electromagnetic shielding may be provided for the first capacitor 114 and the second capacitor 124 to prevent or reduce coupling between those capacitors and the approaching user finger.

A second component 102 comprises a resistance 2 that varies with a different sensed parameter.

In FIG. 5B, the apparatus 10 comprises a component 102 that is serially connected between its own first input capacitor 114 and its own second output capacitor 124, as previously described.

The component 102 comprises in parallel electrical connection a capacitance 4 that varies with a sensed first parameter p and a resistance 2 that varies with a different second sensed parameter q.

The drive circuitry 26 may be configured to provide a time varying input signal 11 that comprises signals at the respective detection frequency or frequencies $\omega_D$, $\omega_{D'}$. The processing circuitry 22 is configured to process the output signal 13 to determine, at at least the detection frequency or frequencies, at least a complex impedance of the component 102.

It is possible that the two sub-components (capacitance 4 and resistance 2) have different frequency responses and it is then possible to read one independently of the other by using a specific probing frequency or frequencies.

The component 102 may lie wholly within a single layer of the apparatus 10.

FIG. 6 illustrates a method 200 of manufacturing an apparatus 10 comprising one or more components 102.

The method 200 comprises, at block 202 selectively forming at least one first input electrode 112 on a flexible substrate 100 at a position that enables the at least one first input electrode 112 to form in the manufactured apparatus 10 a first capacitor 114 with a second input electrode 116.

The method 200 comprises, at block 204 selectively forming at least one first output electrode 122 on the flexible substrate 100 at a position that enables the at least one first output electrode 122 to form in the manufactured apparatus 10 a second capacitor 124 with a second output electrode 126.

The method 200 comprises, at block 206 selectively forming at least one component in electrical connection between the first input electrode 112 and the first output electrode 122.

The method 200 may comprise selectively forming the first input electrode 112, the component 102, and the first output electrode 122 in a common layer and selectively forming the second input electrode 116 in a different layer to the common layer and selectively forming the second output electrode 126 in a different layer to the common layer.

The second input electrode 116 and the second output electrode 126 may occupy different layers (FIG. 3B) or the second input electrode 116 and the second output electrode 126 may occupy the same layer (FIG. 3A).

The first input electrode 112 and the second input electrode 116 may be arranged as a parallel plate capacitor 114.

The first output electrode 122 and the second output electrode 126 may be arranged as a parallel plate capacitor 124.

Figure 7:
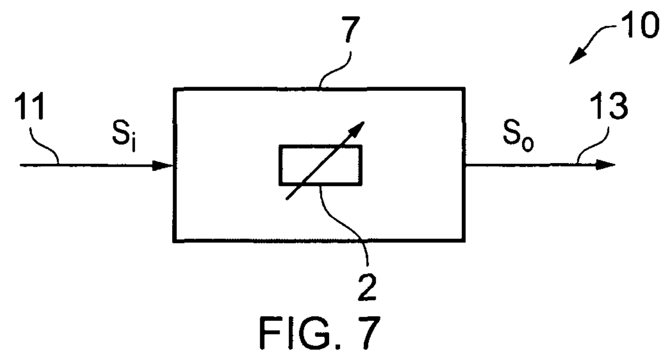
FIG. 7 illustrates an example of an apparatus comprising a capacitance touch sensor arrangement for detecting a user touch and at least one variable resistor sensor integrated within the capacitance touch sensor arrangement.

FIG. 7 illustrates an example of the apparatus 10. The apparatus 10 comprises: a capacitance touch sensor arrangement 7 for detecting a user touch and at least one variable resistor sensor 2 integrated within the capacitance touch sensor arrangement 7.

The component(s) 102 is the whole of or a part of a capacitance touch sensor arrangement 7.

The capacitance touch sensor arrangement 7 is configured to have a variable capacitance that varies, for example, when a user finger touches the capacitance touch sensor arrangement 7. The touch sensor arrangement 7 may comprise a touch surface that is configured for user touch.

The illustrated capacitance touch sensor arrangement 7 is configured as a touch or proximity detector. When a user touches the touch sensor arrangement 7 charge is sourced from or sunk at the user changing the capacitance of the touch sensor arrangement 7.

The at least one variable resistor sensor 2, integrated within the capacitance touch sensor arrangement 7 has a variable resistance that varies with a sensed parameter.

The integration of one or more variable resistor sensors enables the touch sensor arrangement 7 to be used to sense more than touch. A variable resistance sensor 2 may have a variable resistance that varies with, for example, strain, presence of a specific chemical or biochemical molecule, incident light etc.

If, for example, a variable resistor sensor 2 has a variable resistance that varies with strain then it may be used to additionally determine forcefulness of a user touch on the capacitance touch sensor arrangement 7.

If, for example, a variable resistor sensor 2 has a variable resistance that varies with strain then it may be used to additionally determine whether, how and to what degree an apparatus 10 comprising the capacitance touch sensor arrangement 7 is resiliently contorted.

Contortion is the deformation of a body by twisting and/or bending. The extent of distortion facilitated by the body depends upon implementation. Resilient contortion implies that the body stays in its contorted state while held in that state and returns to its equilibrium shape when released.

The apparatus 10 comprises an input configured to receive an input signal 11 comprising a time varying component.

As previously described with reference to FIG. 4, for example, the input signal 11 is provided via the first input capacitor 114 to a component 102 (FIG. 5B) or via multiple first input capacitors 114 to multiple components 102 (FIG. 5A). The apparatus 10 also comprises an output configured to provide an output signal 13 that depends simultaneously upon both the capacitance of the capacitance touch sensor arrangement 7 and the resistance of the variable resistance sensor 2.

As previously described with reference to FIG. 4, for example, the output signal 13 is provided via a second output capacitor 124 from the component 102 (FIG. 5B) or via multiple output capacitors 124 from the multiple components 102 (FIG. 5A).

The integration of the at least one variable resistor sensor 2 within the capacitance touch sensor arrangement 7 results in a single common output that depends simultaneously upon both the capacitance of the capacitance touch sensor arrangement 7 and the resistance of the variable resistance sensor 2.

Figure 8:
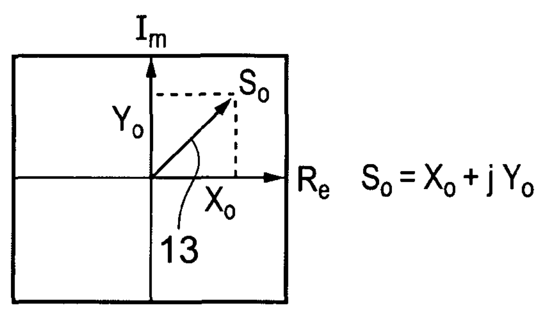
FIG. 8 illustrates an example of an output signal that depends upon both the capacitance of the capacitance touch sensor arrangement and the resistance of the variable resistance sensor.

FIG. 8 is an Argand diagram illustrating an example of an output signal 13 that depends upon both the capacitance of the capacitance touch sensor arrangement 7 and the resistance of the variable resistance sensor 2.

The output signal 13 has a real component Xo and an imaginary component Yo. The imaginary component has a phase lead over the real component of $\pi/2$ radians that is they are orthogonal (in quadrature).

It is therefore possible to process the output signal 13 to determine the real component Xo and an imaginary component Yo. It is also possible to analyse the real component Xo and an imaginary component Yo to detect changes in the capacitance of the capacitance touch sensor arrangement 7 and/or the resistance of the variable resistance sensor 2. This provides useful information to differentiate bending, twisting and stretching of the apparatus including inputs such as touch, hover, pressure.

Figure 9:
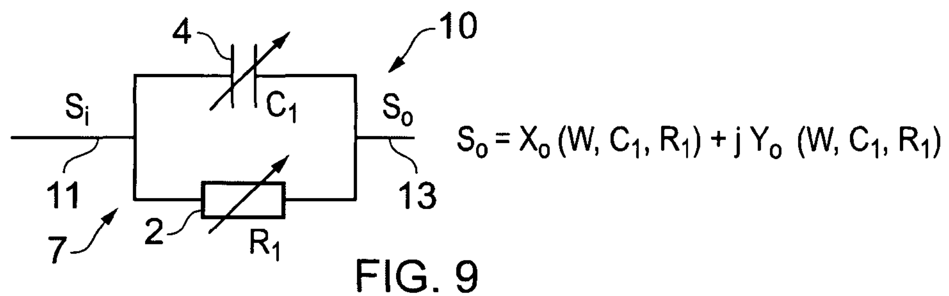
FIG. 9 illustrates a simple example of a capacitance touch sensor arrangement comprising an integrated variable resistor sensor.

FIG. 9 illustrates a simple example of a capacitance touch sensor arrangement 7 comprising an integrated variable resistor sensor 2.

The touch sensor arrangement 7 may be configured as previously described with reference to FIG. 5A, as multiple parallel components 102 each of which is serially connected to an input capacitor 114 and an output capacitor 124. One of the components 102 comprises the capacitance 4 and the other of the components 102 comprises the variable resistor sensor 2.

Alternatively, the touch sensor arrangement 7 may be configured as previously described with reference to FIG. 5B, as a single component 102 serially connected to an input capacitor 114 and an output capacitor 124. The single component 102 comprises, in electrical parallel, the capacitance 4 and the variable resistor sensor 2.

In this example, the resistance R1 of the variable resistor sensor 2 is connected in electrical parallel to the variable capacitance C1 of the capacitance touch sensor arrangement 7. The total impedance of the apparatus 10 is Z(R1)//Z(C1). This may be expressed as Xo(w, C1, R1)+j (w, C1, R1) where w is frequency.

Figure 10:
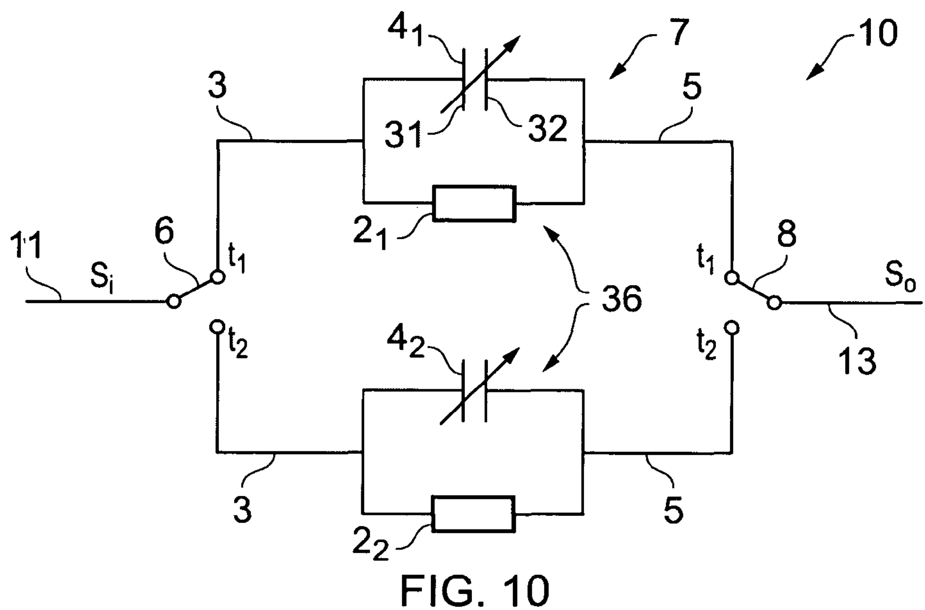
FIG. 10 illustrates an example of a capacitance touch sensor arrangement comprising an integrated variable resistor sensor, where the capacitance touch sensor arrangement comprises a plurality of capacitor cells that are distributed over an area.
Figure 11:
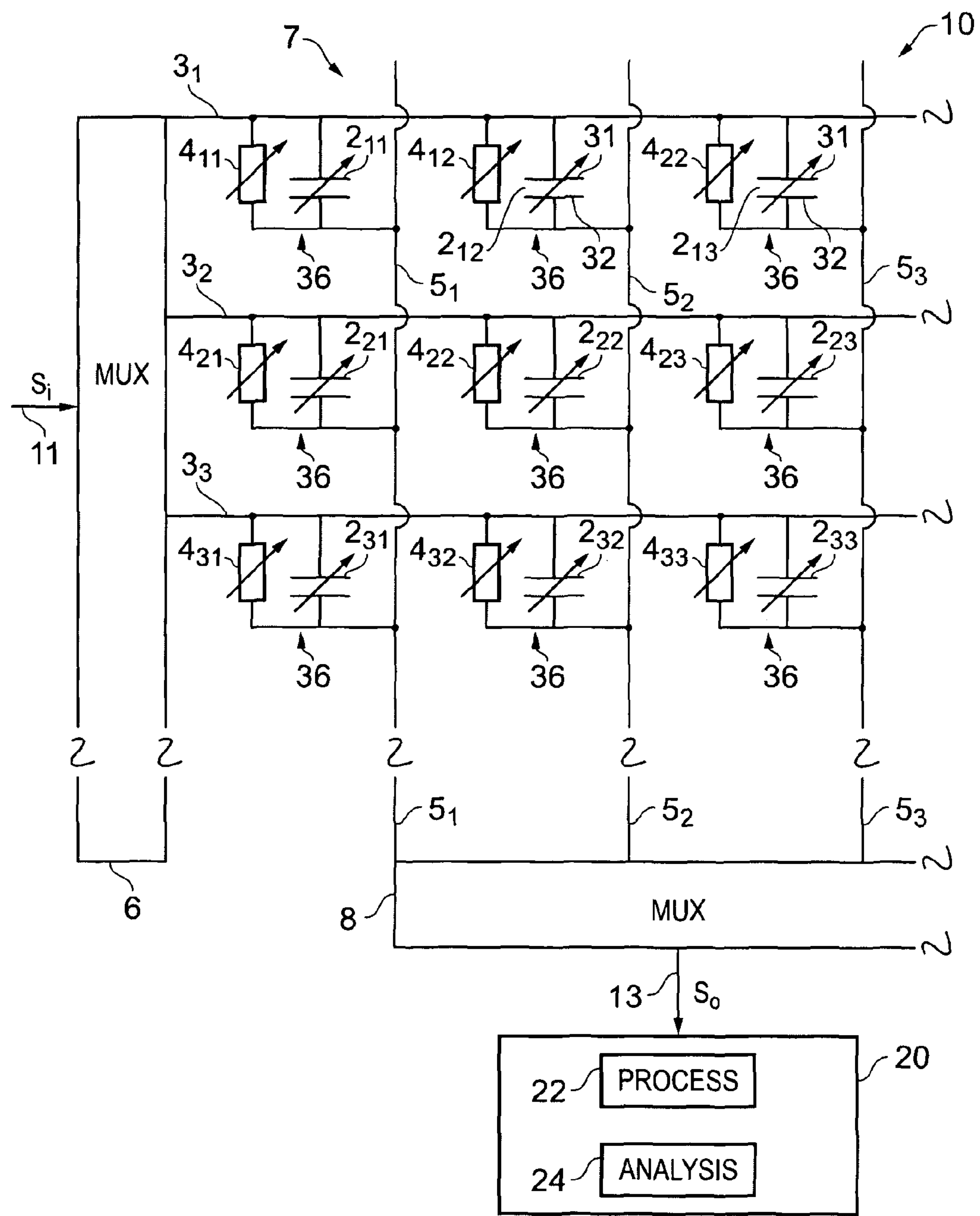
FIG. 11 illustrates an example of a capacitance touch sensor arrangement comprising an integrated variable resistor sensor, where the capacitance touch sensor arrangement comprises a plurality of capacitor cells that are distributed over an area in a regular array.
Figure 12:
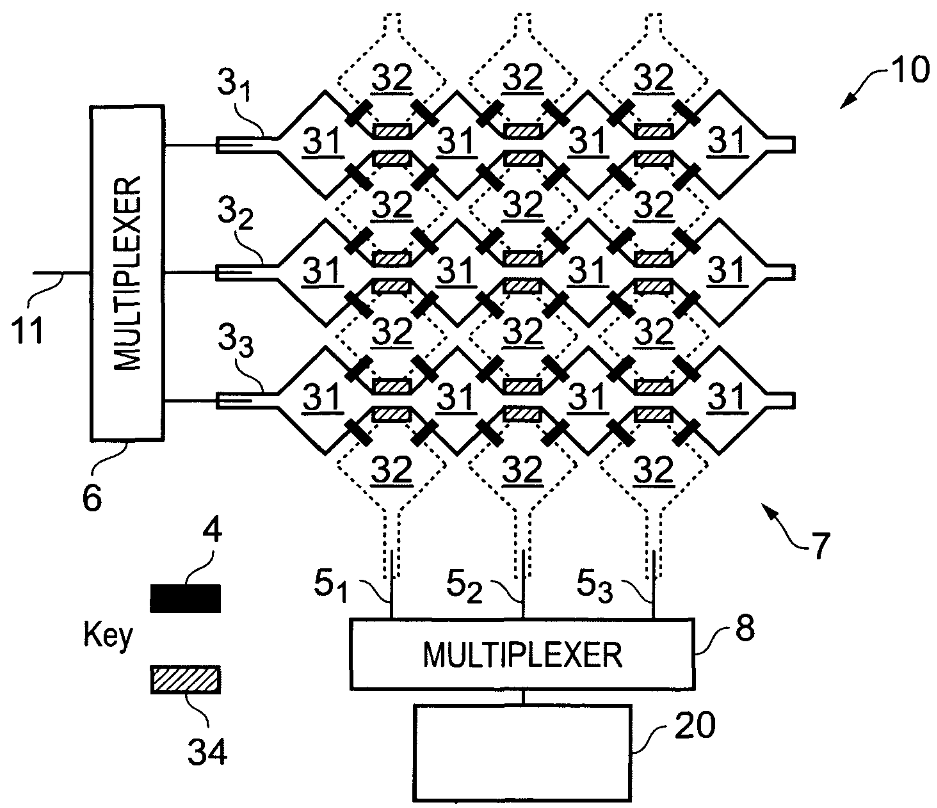
FIG. 12 illustrates an example of a capacitance touch sensor arrangement comprising an integrated variable resistor sensor, where the capacitance touch sensor arrangement comprises a plurality of capacitor cells that are distributed over an area in a regular array and where the capacitor electrodes do not overlap.

It is therefore possible in this example and other examples to match a change in the measured value of Xo and Yo with a change in C1 and/or R1 either algebraically or using pre-stored calibration data. It may, in some circumstances, be necessary to measure X0 and Yo are different values of w. In FIGS. 10, 11 and 12 the capacitance touch sensor arrangement 7 comprises a plurality of capacitor cells 36 that are distributed over an area. When a user touches the touch sensor arrangement 7 charge is sourced from or sunk at the user changing the capacitance of one or more capacitor cells of the touch sensor arrangement 7. Identifying which of the capacitors cells has changed capacitance enables the location(s) of the user touch to be determined.

If the capacitance touch sensor arrangement 7 comprises a plurality of capacitor cells 36 that are distributed over an area. Then some or all of the cells may comprise one or more variable resistor sensors 2. In the examples of FIGS. 10 and 11 a cell comprises a single resistor sensor 2, however, in the example of FIG. 12 a cell comprises multiple resistor sensors 2.

If more than one variable resistor sensor 4 is integrated within the capacitance touch sensor arrangement 7 then the variable resistor sensors 4 may respond to the same or to different sensed parameters.

If more than one variable resistor sensor 4 is integrated within a capacitor cell 36 of the capacitance touch sensor arrangement 7 then the variable resistor sensors 4 may respond to the same or to different sensed parameters.

A variable resistance sensor 4 may have a variable resistance that varies with, for example, strain, presence of a specific chemical or biochemical molecule, light, temperature etc.

The capacitance touch sensor arrangement 7 comprises a plurality of capacitor cells 36 that share in common the input 3 and share in common the output 5. In the illustrated example, each of a plurality of capacitor cells comprises at least one variable resistor sensor 2 having a variable resistance that varies with the sensed parameter. However, in some embodiments every capacitor cell 36 does not have a variable resistor sensor 2. In some embodiments a capacitor cell 36 that has a variable resistor sensor 2 has one or more variable resistor sensors 2 connected in series or parallel.

Each of the plurality of capacitor cells 36 comprises a first capacitor electrode 31 associated with the input 3 and a second capacitor electrode 32 associated with the output 5 and at least one variable resistor sensor 2 connected between the first capacitor electrode 31 and the second capacitor electrode. The variable resistor sensor 2 is therefore connected in electrical parallel to the capacitor formed by the first capacitor electrode 31 and the second capacitor electrode 32.

Each of the capacitor cells 36 is separately tested. First selection circuitry 6 switches to direct the input signal 11 to a particular cell. Second selection circuitry 8 switches to direct the output signal 13 from a particular cell. The first selection circuitry 6 and the second selection circuitry 8 are synchronised so that they simultaneously direct the input signal 11 to and direct the output signal 13 from, the same 'active' capacitor cell 36.

The apparatus 10 also comprises an output configured to provide an output signal 13 that depends simultaneously upon both the capacitance of the capacitance of an active cell of the capacitance touch sensor arrangement 7 and the resistance of the variable resistance sensor 2 (if any) in the active cell.

In FIG. 10, the first selection circuitry 6 is a bi-state switch that switches to direct the input signal 11 to one of two capacitor cells 36. The second selection circuitry 8 is a bi-state switch that switches to direct the output signal 13 from one of two capacitor cells 36.

The capacitor cells 36 may be configured as previously described with reference to FIG. 5A, as multiple parallel components 102 each of which is serially connected to an input capacitor 114 and an output capacitor 124. One of the multiple parallel components 102 comprises the capacitance 4 and the other of the multiple parallel components 102 comprises the variable resistor sensor 2.

Alternatively, the capacitor cells 36 may be configured as previously described with reference to FIG. 5B, as a single component 102 serially connected to an input capacitor 114 and an output capacitor 124. The single component 102 comprises, in electrical parallel, the capacitance 4 and the variable resistor sensor 2.

In FIGS. 11 and 12, the capacitor cells 36 are arranged as an array (grid). The capacitance touch sensor arrangement 7 comprises a distributed network of capacitor cells 36 arranged as an array. In the illustrated examples, the array is regular comprising regularly spaced parallel rows and regularly spaced parallel columns. In the illustrated examples, the array is also orthogonal in that the rows are orthogonal to the columns. However, for some applications the array may not be regular and/or may not be orthogonal.

The first selection circuitry 6 is a multiplexer that switches to direct the input signal 11 to a row of capacitor cells 36. The second selection circuitry 8 is a multiplexer that switches to direct the output signal 13 from a column of capacitor cells 36. Each row therefore shares a common input 3 through multiplexer 6 and each column shares a common output 5 through multiplexer 8.

Each of the capacitor cells 36 is separately tested. The multiplexer 6 switches to direct the input signal 11 to a particular 'active' row of cells 36. The multiplexer 8 switches to direct the output signal 13 from a particular 'active' row of cells. The first selection circuitry 6 and the second selection circuitry 8 are synchronised so that they simultaneously direct the input signal 11 to and direct the output signal 13 from, the same 'active' capacitor cell 36 that is in both the active row and the active column.

The first selection circuitry 6 is configured to sequence the row to which the input signal 11 is provided through a series of different rows. Each row may be made active once in a period T1 for a time T2. The second selection circuitry 8 is configured to sequence the column from which the output signal 13 is received through a series of different columns. Each column may be made active once in the time period T2.

It should be appreciated that although it is described that input is provided to rows and output taken from columns, this may be reversed, so that input is provided to columns and output taken from rows. Depending upon context, the terms 'row' and 'column' may therefore be interchanged.

In these examples, the capacitance touch sensor arrangement 7 comprises a distributed network of electrodes arranged as a regular array comprising rows and columns. Each row has a common distribution of capacitance and resistance and each column has a common distribution of capacitance and resistance. The first selection circuitry 6 is configured to selectively provide the input signal 11 to a first portion of the capacitance touch sensor arrangement 7 and second selection circuitry 8 is configured to selectively receive the output signal 13 from a second portion of the capacitance touch sensor arrangement 7. Changes in the common distribution of capacitance and resistance can therefore be detected.

Each row comprises a first plurality of interconnected first electrodes 31 and each column comprises a second plurality of interconnected second electrodes 32 and at least one variable resistor sensor 4 is associated with each row and/or column. In the illustrated examples, at least one variable resistor sensor 2 is connected between each row interconnect 3 and each column interconnect 5, where the rows and column cross, and connected in parallel to a capacitor formed by a first electrode and a second electrode.

The apparatus 10 comprises processing circuitry 22 configured to process output signals 13 from different areas (cells) of the capacitance touch sensor arrangement 7, each of which has an integrated at least one variable sensor, to determine the current capacitance for the different areas and the current resistance for the different areas. The apparatus 10 comprises analysis circuitry 24 configured to analyse the current capacitance and the current resistance for the different areas (cells).

The processing circuitry 22 and the analysis circuitry may be integrated in a module 20 or they may be provided separately.

In FIG. 11, each capacitor cell comprises a single capacitor formed from an input capacitor electrode 31 and an output capacitor electrode 32. Each capacitor cell 36 also comprises a variable resistor sensor 4 connected in electrical parallel to the capacitor formed by the input capacitor electrode 31 and the output capacitor electrode 32.

Each of the capacitor cells 36 may be configured as previously described with reference to FIG. 5A, as multiple parallel components 102 each of which is serially connected to an input capacitor 114 and an output capacitor 124. One of the multiple parallel components 102 comprises a capacitance 4 and the other of the multiple parallel components 102 comprises a variable resistor sensor 2.

Alternatively, each of the capacitor cells 36 may be configured as previously described with reference to FIG. 5B, as a single component 102 serially connected to an input capacitor 114 and an output capacitor 124. The single component 102 comprises, in electrical parallel, the capacitance 4 and the variable resistor sensor 2.

Alternatively, the array of capacitor cells 36 may be configured as a single component 102. Each row 3 may be serially connected to the multiplexer 6 via an input capacitor 114. Each column 4 may be serially connected to the multiplexer 8 via an output capacitor 124.

In FIG. 12, the rows of input capacitor electrodes 31 connected to the input 3 via multiplexer 6 form an input electrode array. There is a pitch D between the rows and between the input capacitor electrodes 31. The columns of output capacitor electrodes 32 connected to the output 5 via multiplexer 8 form an output electrode array. There is a pitch D between the rows and between the output capacitor electrodes 31. The input electrode array and the output electrode array are parallel and are off-set from each other by D12 in the row direction and the column direction. The input capacitor electrodes 31 and the output capacitor electrodes 32 therefore no not overlap but do approach closely in a lateral direction (in the plane of the array).

FIG. 13 schematically illustrates a capacitor cell 36 associated with input capacitor electrode $31_{n,m}$, where n designates a row and m designates a column. The input capacitor electrode $31_{n,m}$ is adjacent 4 distinct output capacitor electrodes (see FIG. 12). There is one $32_{n-1,m}$ to the top-left, one $32_{n-1,m+1}$ to the top right, one $32_{n,m}$ to the bottom left and one $32_{n,m+1}$ to the bottom right. Each of the output capacitor electrodes $32_{n-,m}$; $32_{n-1,m+1}$; $32_{n,m}$ and $32_{n,m+1}$ pairs laterally with the input capacitor electrode $31_{n,m}$ to form a capacitor 4.

A variable resistor sensor 2 is formed in electrical parallel to each of the capacitors 4. Each of the variable resistors sensors 4 is formed as a bridge across a gap between the input capacitor electrode $31_{n,m}$ and the respective one of the paired output capacitor electrodes 32.

Spacers 34 may be used to separate the interconnect between the input capacitor electrodes 31 in a row and the interconnect between the output capacitor electrodes 32 in a column where the rows and columns cross over. The spacers may be a dielectric. The spacers 34 could also be piezoresistive, force and pressure sensitive and form the variable resistor sensors 4.

Each of the capacitor cells 36 may be configured as previously described with reference to FIG. 5A, as multiple parallel components 102 each of which is serially connected to an input capacitor 114 and an output capacitor 124. One of the multiple parallel components 102 comprises a capacitance 4 and the other of the multiple parallel components 102 comprises a variable resistor sensor 2.

Alternatively, each row 3 and each column 5 of the array of capacitor cells 36 may be configured as a single component 102. Each row 3 may be serially connected to the multiplexer 6 via an input capacitor 114. Each column 4 may be serially connected to the multiplexer 8 via an output capacitor 124.

FIGS. 14A and 14B illustrates a system comprising a signal generator 26 for providing the input signal 11 to the capacitance touch sensor arrangement 7 with integrated at least one variable resistor sensor 2 and processing circuitry 22 configured to detect a first signal value comprising at least a real component and configured to detect a second signal value comprising at least an imaginary component, wherein the first component and the second component have a known phase off-set. The first signal value is typically the real component Xo of the output signal 13 and the second value is typically the imaginary component Yo of the output signal 13.

In FIG. 14A, the signal generator 26 simultaneously provides an input signal 11 that comprise an alternating component and a static component. The alternating component may be at a single frequency or a mixture of frequencies.

The processing circuitry 22 comprises a low-pass filter 40 that filters the output signal 13 blocking the alternating component but allowing the static (dc) component Xo to pass.

The processing circuitry 22 comprises in parallel to the low-pass filter 40 a high pass filter 42 that filters the output signal 13 blocking the static (dc) component but allowing the alternating (ac) component Yo to pass. A rectifier and filter 44 may be used further process the filtered signal.

In FIG. 14A, the signal generator 26 simultaneously provides an input signal 11 that comprises an alternating component only. The alternating component may be at a single frequency.

The processing circuitry 22 comprises a lock-in amplifier 50 that receives the output signal 13 as an input and the input signal 11 as a reference. It produces as a first output, Xo, the in-phase component and as a second output, Ye, the quadrature-phase component.

After a signal Xo dependent upon the current resistance and a signal Yo dependent upon the current capacitance have been isolated by the processing circuitry 22 they may be analysed.

Analysis circuitry 24 may be configured to analyse the current capacitance and the current resistance for the different capacitor cells 36 (located at different areas) to:

a) detect a location of user touch input b) estimate a magnitude of pressure applied by a user touch input c) estimate a contortion of the apparatus 10 by the user The analysis may use stored calibration data.

The analysis circuitry 24 may be configured to analyse the current capacitance Yo and the current resistance Xo for the different areas/cells 36 to detect a pattern of user touch inputs.

The pattern may be used to disambiguate between a touch input and a contortion. It may also be used to disambiguate between different contortions such as bend and twist. It may also be used to estimate the contortion of the apparatus 10 by the user.

Disambiguation between a touch input and a contortion may be achieved because when there is a touch input the touch (capacitance change) and the strain (variable resistance change) occur at the same area (the same cell). This is illustrated in FIG. 17.

When there is a contortion of the apparatus 10, for example as illustrated in FIG. 18, the position where the user bends the apparatus is different to where (A1, A2; B1, B2) the user holds the apparatus 10 to apply the contorting force F. There will therefore be an area C where there is strain (variable resistance change) without touch (capacitance change).

When the current capacitance and the current resistance, for an area, are indicative of a deforming touch by a user, the current capacitance and the current resistance for the area are used to detect a user touch input at the area.

When the current capacitance and the current resistance, for an area are not indicative of a deforming touch by a user, the current capacitance and the current resistance for the area may be used in determining a contortion of the apparatus 10.

Disambiguation between contortions may be achieved by analysing the spatial distribution of strain (variable resistance change). The analysis circuitry may be configured to analyse a spatial distribution of the current capacitance and the current resistance for the different areas, to disambiguate different contortions of the apparatus.

For example, if two variable resistor sensors lie apart in a common plane, they are exposed to opposite strain when the apparatus is bent in the plane. The variable resistor sensor on the outside of the bend suffers compression (variable resistance decrease) whereas the other variable resistor sensor on the inside of the bend suffers expansion (variable resistance increase).

For example, if variable resistor sensors lie along a line in a common plane with a first variable resistor sensor being positioned towards a first edge of the apparatus, a second variable resistor sensor being positioned away from the first edge and away from a second edge of the apparatus that opposes the first edge and a third variable resistor sensor being positioned towards the second edge of the apparatus, then when the apparatus is twisted the plane also twists. The first and third variable resistor sensors that are positioned towards the edges suffer expansion (variable resistance increase) whereas the second variable resistor sensor does not or does not to the same extent.

It may still be possible to operate the analysis circuitry 24 to detect a new touch even during a contortion of the apparatus. The output from the capacitance touch sensor arrangement 7 with integrated at least one variable resistor sensor 2 is constant while the apparatus remains in a contorted state and deviations from the constant value may be used to detect touches while the contortion is stable and unchanging.

It may be possible to operate the analysis circuitry 24 in a touch only mode in which it analyses only the current capacitance for the different areas to detect a pattern of user touch inputs as well as one or more other modes where the current resistance and capacitance for the different areas is used to detect other parameters.

The analysis circuitry 24 may be configured to compensate for slowly varying changes in the resistance, for example as a result of ambient temperature.

FIG. 17 illustrates an example cross-section through a portion of an example of the apparatus 10. The capacitance touch sensor arrangement 7 and the at least one variable resistor sensor 2 integrated within the capacitance touch sensor arrangement 7 are, in this example, flexible and stretchable, being capable of withstanding strain in excess of 5%. The capacitance touch sensor arrangement 7 and the at least one variable resistor sensor 2 integrated within the capacitance touch sensor arrangement 7 may be transparent. The electrodes 31, 32 of the capacitance touch sensor arrangement 7 are distributed on a conformal, stretchable membrane 60 and may be applied to the substrate 60 using printing technologies.

The substrate 60 may, for example, comprise: polydimethylsiloxane (PDMS), polyurethane, polyethylene terephthalate (PET), polyethylene napthalate (PEN), flexible glass, stretchable substrates e.g. elastomeric silicones (e.g. polydimethylsiloxane) or polyurethanes.

The electrodes including the capacitor electrodes 31, 32, the first and second input electrodes 112, 116, and the first and second output electrodes 122, 126 may be formed from one or more of: metal, silver nanowires, carbon nanotubes networks, graphene derivatives, indium tin oxide, graphene.

A separator 62 separates the capacitor electrodes 31, 32. The separator 62 may be a contortable dielectric between the electrodes where the dielectric properties of the contortable dielectric change when contorted. The separator 62 may, for example, be a dielectric, quantum tunnelling composite a polymer/elastomer, or an ion gel.

The variable resistor sensors 2 integrated within the capacitance touch sensor arrangement 7 may be formed from: gold, graphene, carbon nanotubes and/or silver nanowires.

For example, a variable resistor sensor 2 may be a track of gold. For example, a variable resistor sensor 2 may be a track of gold that has a width and/or thickness of less than 50 nm.

As previously described, different variable resistor sensors 2 that vary with different sensed parameters may be formed. The sensed parameters include strain, a predetermined biological or chemical molecule, incident light, ambient temperature etc.

Although FIG. 18, illustrates an example of the apparatus 10 that may detect contortion, other examples of apparatus 10 may not and the variable resistance sensors 2 may respond to parameters other than stress. The substrate 60 may be rigid.

FIG. 19 illustrates a method 70 of manufacturing one example of a capacitance touch sensor arrangement 7 comprising at least one integrated variable resistor 2.

At block 71, one or more first capacitor electrodes 31 are selectively formed.

At block 72, one or more second capacitor electrodes 32 are selectively formed.

At block 73, at least one variable resistor sensor 2 is formed between a first capacitor electrode 31 and an adjacent second capacitor electrode 32. The variable resistor sensor 2 can be formed using soft deformable materials which can be transparent The second capacitor electrodes 32 are separated from the first capacitor electrodes by dielectric. In some but not necessarily all embodiments some or all of the variable resistor sensors 2 may be arranged to provide the separation between the first capacitor electrodes 31 and the second capacitor electrodes 32.

At block 74, an encapsulating layer is formed.

The method also comprises the method 200 previously described in relation to FIG. 6, for forming a first input capacitor 114 and a second output capacitor 124 connected to the component 102, where the component 102 is the capacitance 4 and/or the resistance 2.

The method may additionally comprise, in some embodiment, forming electrically parallel first interconnects that serially interconnect different capacitor electrodes, forming electrically parallel second interconnects that serially interconnect different second capacitor electrodes. The method may also comprise forming variable resistor sensors 2 between different pairs of first and second interconnects. Each variable resistor sensor 2 has a resistance greater that a combined resistance of a current path through the first and second interconnects to which it is connected. At least one variable resistor sensor 2 may be formed in electrical parallel to each capacitor formed by the pairing of adjacent first and second electrodes.

The term 'connected' means operationally coupled and any number or combination of intervening elements can exist (including no intervening elements).

The analysis circuitry 24 previously described may be implemented using instructions that enable hardware functionality, for example, by using executable computer program instructions in a general-purpose or special-purpose processor that may be stored on a computer readable storage medium (disk, memory etc) to be executed by such a processor 62.

Referring to FIG. 15, a processor 62 is configured to read from and write to the memory 64. The processor 62 may also comprise an output interface via which data and/or commands are output by the processor 62 and an input interface via which data and/or commands are input to the processor 62.

The memory 64 stores a computer program 66 comprising computer program instructions that control the operation of the apparatus 10 when loaded into the processor 62. The computer program instructions 66 provide the logic and routines that enables the apparatus to perform the methods described. The processor 62 by reading the memory 64 is able to load and execute the computer program 66.

The apparatus 10 therefore comprises: at least one processor 62; and at least one memory 64 including computer program code 66, the at least one memory 64 and the computer program code 66 configured to, with the at least one processor 62, cause the analysis circuitry to perform as described.

The computer program may arrive at the apparatus 10 via any suitable delivery mechanism 68. The delivery mechanism 68 may be, for example, a non-transitory computer-readable storage medium, a computer program product, a memory device, a record medium such as a compact disc read-only memory (CD-ROM) or digital versatile disc (DVD), an article of manufacture that tangibly embodies the computer program 66. The delivery mechanism may be a signal configured to reliably transfer the computer program 66. The apparatus 10 may propagate or transmit the computer program 66 as a computer data signal.

Although the memory 64 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term 'circuitry' refers to all of the following:

(a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device."

As used here 'module' refers to a unit or apparatus that excludes certain parts/components that would be added by an end manufacturer or a user.

The blocks illustrated in the FIGS. 6 and 19 do not necessarily imply that there is a required or preferred order for the blocks and the order and arrangement of the block may be varied. Furthermore, it may be possible for some blocks to be omitted.

Although embodiments of the present invention have been described in the preceding paragraphs with reference to various examples, it should be appreciated that modifications to the examples given can be made without departing from the scope of the invention as claimed.

For example, although some of the above described examples (e.g. FIG. 9) illustrated have the resistance R1 of the variable resistor sensor 2 connected in electrical parallel to the variable capacitance C1 of the capacitance touch sensor arrangement 7, in other arrangements the resistance R1 of the variable resistor sensor 2 may be connected in electrical series with the variable capacitance C1 of the capacitance touch sensor arrangement 7. The electrical connection of the variable resistor sensor 2 to the capacitor of the touch sensor arrangement 7 may therefore by a parallel electrical connection or a series electrical connection.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:

a flexible substrate;

a component supported by the flexible substrate;

a first input electrode, supported by the flexible substrate and configured to form a first capacitor with a second input electrode and to provide an input to the component;

a first output electrode, supported by the flexible substrate and configured to form a second capacitor with a second output electrode and to provide an output from the component, wherein the component, the first input electrode and the first output electrode are surface-mounted and/or printed/stamped/pressed and/or transparent, and wherein the second input electrode and the second output electrode are surface-mounted and/or printed and/or transparent.

2. An apparatus as claimed in claim 1, wherein the component, the first input electrode and the first output electrode are flexible, and wherein the second input electrode and the second output electrode are flexible.

3. An apparatus as claimed in claim 1, wherein the first input electrode, the component, and the first output electrode occupy a common layer.

4. An apparatus as claimed in claim 1, wherein the first input electrode and the second input electrode occupy different layers, and wherein the first input electrode and the second input electrode are arranged as a parallel plate capacitor.

5. An apparatus as claimed in claim 1, wherein the first output electrode and the second output electrode occupy different layers, and wherein the first input electrode and the second input electrode are arranged as a parallel plate capacitor.

6. An apparatus as claimed in claim 1, further comprising drive circuitry configured to provide a time varying input signal at the second input electrode, and further comprising detection circuitry configured to detect a time varying output signal at the second output electrode.

7. An apparatus as claimed in claim 1, wherein the detection circuitry is configured to detect at least a complex impedance.

8. An apparatus as claimed in claim 1, wherein the flexible substrate overlies a flexible display.

9. An apparatus as claimed in claim 1, wherein the flexible substrate comprises multiple through apertures.

10. An apparatus as claimed in claim 1, wherein the component is whole or part of a capacitance touch sensor arrangement configured to have a variable capacitance that varies when a user finger touches or approaches the capacitance touch sensor arrangement, and wherein the capacitance touch sensor arrangement comprises at least one variable resistor sensor wherein the variable resistor sensor has a variable resistance that varies with a sensed parameter.

11. An apparatus as claimed in claim 1, wherein the capacitance touch sensor arrangement and the at least one variable resistor are configured to provide a single output signal via the first output electrode that depends simultaneously upon both a capacitance of the capacitance touch sensor arrangement and a resistance of the variable resistance sensor.

12. An apparatus comprising:

a flexible substrate;

a component supported by the flexible substrate;

a first input electrode, supported by the flexible substrate and configured to form a first capacitor with a second input electrode and to provide an input to the component;

a first output electrode, supported by the flexible substrate and configured to form a second capacitor with a second output electrode and to provide an output from the component, wherein at a detection frequency or frequencies, an impact of an electrical impedance of the component on measurements is resolvable from an impact of the total combined impedance on the measurements, and wherein at a detection frequency or frequencies, the electrical impedance of the component varies with at least one parameter.

13. An apparatus comprising:

a flexible substrate;

a component supported by the flexible substrate;

a first input electrode, supported by the flexible substrate and configured to form a first capacitor with a second input electrode and to provide an input to the component;

a first output electrode, supported by the flexible substrate and configured to form a second capacitor with a second output electrode and to provide an output from the component, wherein, at detection frequencies at which an impedance of the component is detected, the first capacitor has an electrical impedance that changes in response to changes in a first parameter less than the electrical impedance of the component changes in response to the changes in the first parameter, and wherein, at detection frequencies at which an impedance of the component is detected, the second capacitor has an electrical impedance that changes in response to changes in a first parameter less than the electrical impedance of the component changes in response to changes in the first parameter.

14. An apparatus comprising:

a flexible substrate;

a component supported by the flexible substrate;

a first input electrode, supported by the flexible substrate and configured to form a first capacitor with a second input electrode and to provide an input to the component;

a first output electrode, supported by the flexible substrate and configured to form a second capacitor with a second output electrode and to provide an output from the component, wherein, at detection frequencies at which an impedance of the component is detected, the first capacitor has an electrical impedance that changes in response to changes in a second parameter less than the electrical impedance of the component changes in response to changes in the second parameter and the second capacitor has an electrical impedance that changes in response to changes in a second parameter less than the electrical impedance of the component changes in response to changes in the second parameter.

15. An apparatus as claimed in claim 1, wherein, the component comprises a capacitor that has a capacitance that varies with a sensed parameter.

16. An apparatus as claimed in claim 1, wherein, the component comprises a resistor that has a resistance that varies with a sensed parameter.

17. An apparatus as claimed in claim 1, wherein, the component has a capacitance that varies when a user finger touches or approaches the apparatus.

18. An apparatus comprising:

a flexible substrate;

a component supported by the flexible substrate;

a first input electrode, supported by the flexible substrate and configured to form a first capacitor with a second input electrode and to provide an input to the component;

a first output electrode, supported by the flexible substrate and configured to form a second capacitor with a second output electrode and to provide an output from the component, and further comprising a plurality of components, wherein each component is supported by the flexible substrate, wherein each component is configured to receive an input via a first capacitor and to provide an output via a second capacitor, wherein each of the components is configured to sense a different parameter.

19. A method of manufacturing an apparatus comprising a component, comprising:

selectively forming at least one first input electrode on a flexible substrate at a position that enables the at least one first input electrode to form in the manufactured apparatus a first capacitor with a second input electrode;

selectively forming at least one first output electrode on the flexible substrate at a position that enables the at least one first output electrode to form in the manufactured apparatus a second capacitor with a second output electrode; and selectively forming at least one component in electrical connection between the first input electrode and the first output electrode, wherein the component, the first input electrode and the first output electrode are surface-mounted and/or printed/stamped/pressed and/or transparent, and wherein the second input electrode and the second output electrode are surface-mounted and/or printed and/or transparent.

20. A method as claimed in claim 19 further comprising:

selectively forming the first input electrode, the component, and the first output electrode in a common layer;

selectively forming the second input electrode in a different layer to the common layer; and selectively forming the second output electrode in a different layer to the common layer.

* * * * *